(12) United States Patent
Kastler et al.

(10) Patent No.: US 8,653,227 B2
(45) Date of Patent: Feb. 18, 2014

(54) PROCESS FOR PREPARING REGIOREGULAR POLY-(3-SUBSTITUTED) THIOPHENES, SELENOPHENES, THIAZOLES AND SELENAZOLES

(75) Inventors: Marcel Kastler, Basel (CH); Silke Annika Koehler, Basel (CH)

(73) Assignees: BASF SE, Ludwigshafen (DE); Rieke Metals, Inc., Lincoln, NE (US)

( * ) Notice: Subject to any disclaimer, the term of this patent is extended or adjusted under 35 U.S.C. 154(b) by 90 days.

(21) Appl. No.: 13/378,069

(22) PCT Filed: Jun. 14, 2010

(86) PCT No.: PCT/EP2010/058300
§ 371 (c)(1),
(2), (4) Date: Dec. 14, 2011

(87) PCT Pub. No.: WO2010/146013
PCT Pub. Date: Dec. 23, 2010

(65) Prior Publication Data
US 2012/0088900 A1    Apr. 12, 2012

(30) Foreign Application Priority Data
Jun. 15, 2009    (EP) ..................................... 09162723

(51) Int. Cl.
*C08G 75/00*    (2006.01)
(52) U.S. Cl.
USPC ............ 528/377; 528/378; 528/370; 528/380
(58) Field of Classification Search
USPC .................................. 528/380, 378, 377, 370
See application file for complete search history.

(56) References Cited

U.S. PATENT DOCUMENTS

| 2004/0254336 A1 | 12/2004 | Xiao et al. |
| 2008/0188637 A1 | 8/2008 | Rieke |
| 2009/0253893 A1 | 10/2009 | Rieke |
| 2011/0136973 A1 | 6/2011 | Kastler et al. |
| 2011/0155248 A1 | 6/2011 | Kastler et al. |
| 2011/0168264 A1 | 7/2011 | Kastler et al. |

FOREIGN PATENT DOCUMENTS

WO    2007 011945    1/2007

OTHER PUBLICATIONS

U.S. Appl. No. 13/809,496, filed Jan. 10, 2013, Koehler, et al.
Osaka, Itaru et al., "Advances in Molecular Design and Synthesis of Regioregular Polythiophenes", Accounts of Chemical Research, vol. 41, No. 9, pp. 1202-1214, XP-002539451. (2008).
McCullough, Richard, "The Chemistry of Conducting Polythiophenes", Advanced Material, vol. 10, No. 2, pp. 93-116. (1998).
International Search Report issued on Jul. 27, 2010 in PCT/EP10/058300 filed on Jun. 14, 2010.

*Primary Examiner* — Shane Fang
(74) *Attorney, Agent, or Firm* — Oblon, Spivak, McClelland, Maier & Neustadt, L.L.P.

(57) ABSTRACT

A process for preparing a regioregular homopolymer or copolymer of 3-substituted thiophene, 3-substituted selenophene, 3-substituted thiazol or 3-substituted selenazol by a) reacting a 3-substituted 2,5-dihalothiophene, 2,5-dihaloselenophene, 2,5-dihalothiazol or 2,5-dihaloselenazol with reactive zinc, magnesium and/or an organomagnesium halide to give an organozinc or organomagnesium intermediate containing one halozinc or one halomagnesium group, b) bringing the organozinc or the organomagnesium intermediate into contact with a Ni(II), Ni(O), Pd(II) or Pd(0) catalyst to initiate the polymerization reaction, and c) polymerizing the organozinc or the organomagnesium intermediate to give a regioregular head-to-tail homopolymer or copolymer of 3-substituted thiophene, 3-substituted selenophene, 3-substituted thiazol or 3-substituted selenazol characterized in that the polymerization reaction is carried out at a temperature rising from a lower temperature $T_1$ to a higher temperature $T_2$ during a time $t_1$, wherein $T_1$ is in the range of from −40 to 5° C. and $T_2$ is in the range of from −20 to 40° C., wherein $T_2-T_1$ is at least 10° C. and the average rate of increase $(T_2-T_1)/t_1$ is in the range of from 0.05° C./min to 1° C./min.

20 Claims, No Drawings

PROCESS FOR PREPARING REGIOREGULAR POLY-(3-SUBSTITUTED) THIOPHENES, SELENOPHENES, THIAZOLES AND SELENAZOLES

CROSS-REFERENCE TO RELATED APPLICATIONS

This application is a National Stage of PCT/EP2010/058300 filed on Jun. 14, 2010. This application is based upon and claims the benefit of priority to European Application No. 09162723.2 filed on Jun. 15, 2009.

BACKGROUND OF THE INVENTION

The invention relates to a process for preparing regioregular poly-(3-substituted) thiophenes, selenophenes, thiazoles and selenazoles.

The formidable building block for the development of (micro)electronics during the last one-half of the 20$^{th}$ century is the field-effect transistor (FET) based on inorganic electrodes, insulators, and semiconductors. These materials have proven to be reliable, highly efficient, and with performance that increases periodically according to the well-known Moore's law. Rather than competing with conventional silicon technologies, an organic FET (OFET) based on molecular and polymeric materials may find large scale applications in low-performance memory elements as well as integrated optoelectronic devices, such as pixel drive and switching elements in active-matrix organic light-emitting diode displays, RFID tags, smart-ID tags, and sensors.

As a result of the development of several conductive or semiconductive organic polymers, the application of those as active layer, thus the semiconductor, in organic thin-film transistors (OTFTs) has gained increasing attention.

The use of organic semiconductors in OTFTs has some advantages over the inorganic semiconductors used to date. They can be processed in any form, from the fiber to the film, exhibit a high mechanical flexibility, can be produced at low cost and have a low weight. The significant advantage is, however, the possibility of producing the entire semiconductor component by deposition of the layers from solution on a polymer substrate at atmospheric pressure, for example by printing techniques, such that inexpensively producible FETs are obtained.

The performance of the electronic devices depends essentially on the mobility of the charge carriers in the semiconductor material and the ratio between the current in the on-state and the off-state (on/off ratio). An ideal semiconductor therefore has a minimum conductivity in the switched-off state and a maximum charge carrier mobility in the switched-on state (mobility above $10^{-3}$ cm$^2$V$^{-1}$s$^{-1}$ on/off ratio above $10^2$). In addition, the semiconductor material has to be relatively stable to oxidation, i.e. has to have a sufficiently high ionization potential, since its oxidative degradation reduces the performance of the component.

In the prior art, a regioregular head-to-tail poly(3-alkylthiophene), in particular poly(3-hexylthiophene) (P3HT) has been suggested for use as semiconducting material, as it shows a charge carrier mobility between $1 \cdot 10^{-5}$ and 0.1 cm$^2$V$^{-1}$s$^{-1}$. Regioregular poly(3-alkylthiophene) has shown good performance as the active hole transporting layer in field effect transistors and photovoltaic cells. However, the charge carrier mobility, and hence the performance of these applications, have been shown to be strongly dependent on the regioregularity of the alkyl side chains of the polymer backbone. A high regioregularity means a high degree of head-to-tail couplings and a low amount of head-to-head or tail-to-tail couplings. A high regioregularity leads to good packing of these polymers in the solid state and hence a high charger carrier mobility. Typically a regioregularity greater than 90% is necessary for good performance.

Several methods to produce highly regioregular poly(3-alkylthiophene) have been reported, for example in the review of R. D. McCullough, Ad. Mater., 1998, 10(2), 93-116 and the references cited therein. WO 93/15086 discloses the preparation of highly regioregular poly(3-alkylthiophene) starting from 2,5-dibromo-3-alkylthiophene, wherein the educt is added to a solution of highly reactive "Rieke zinc" (Zn*) to form a mixture of the isomers 2-bromo-3-alkyl-5-(bromozinc)thiophene and 2-(bromozinc)-3-alkyl-5-bromothiophene. The addition of Ni(dppe)Cl$_2$ (1,2-bis(diphenylphosphino)ethane-nickel(II)chloride) as nickel cross-coupling catalyst leads to the formation of a regioregular head-to-tail (HT) poly(3-alkylthiophene).

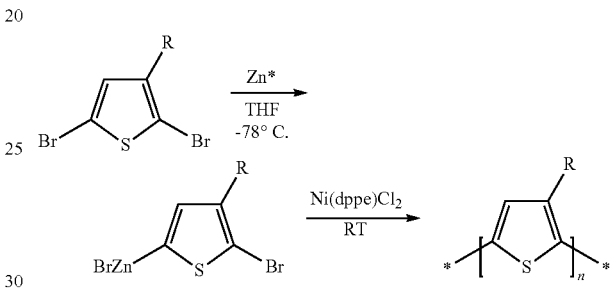

According to EP 1 028 136, 2,5-dibromo-3-alkylthiophene is reacted with methyl magnesium bromide in THF. The resulting organomagnesium intermediate, which is likewise a mixture of the two regioisomers, is then reacted with a nickel (II) catalyst, Ni(dppe)Cl$_2$, to give the regioregular polymer.

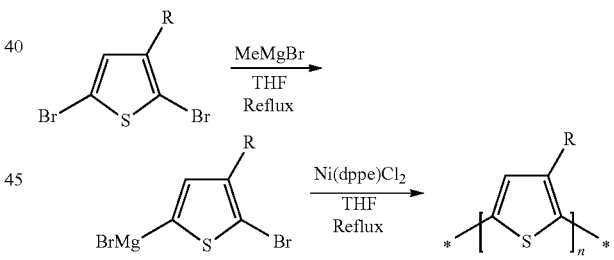

It is an object of the present invention to provide an improved process for preparing a regioregular poly(3-substituted thiophene) or poly(3-substituted selenophene) starting from 3-substituted 2,5-dihalothiophene or 2,5-dihaloselenophene, which gives poly(3-substituted thiophene) or poly (3-substituted selenophene) having a higher regioregularity.

BRIEF SUMMARY OF THE INVENTION

The problem is solved by a process for preparing a regioregular homopolymer or co-polymer of 3-substituted thiophene, 3-substituted selenophene, 3-substituted thiazol and/or 3-substituted selenazol by
a) reacting a 3-substituted 2,5-dihalothiophene, 2,5-dihaloselenophene, 2,5-dihalothiazol or 2,5-dihaloselenazol with reactive zinc, magnesium or an organomagnesium halide to give an organozinc or organomagnesium intermediate containing one halozinc or one halomagnesium group, b) bringing the organozinc or the organomagnesium intermediate into contact with a Ni(II), Ni(0), Pd(II) and Pd(II) catalyst to initiate the polymerization reaction, and c) polymerizing the organozinc or the organomagnesium intermediate to give a regioregular head-to-tail homopolymer or copolymer of 3-substituted thiophene, 3-substituted selenophene, 3-substituted thiazol or 3-substituted selenazol characterized in that the polymerization reaction is carried out at a temperature rising from a lower temperature $T_1$ to a higher temperature $T_2$ during a time $t_1$, wherein $T_1$ is in the range of from −40 to 5° C. and $T_2$ is in the range of from −20 to 40° C., wherein $T_2$−$T_1$ is at least 10° C. and average rate of increase $(T_2-T_1)/t_1$ is in the range of from 0.05° C./min to 1° C./min.

DETAILED DESCRIPTION OF THE INVENTION

In a first step a), 3-substituted 2,5-dihalothiophene is reacted with reactive zinc or an organomagnesium halide to give an organozinc or organomagnesium intermediate containing one halozincio or one halomagnesio group. Preferably, the 3-substituted 2,5-dihalothiophene, 2,5-dihaloselenophene, 2,5-dihalothiazol or 2,5-dihaloselenazol is a compound of general formula (I)

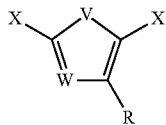

wherein
R is independently selected from a) a $C_{1-20}$ alkyl group, b) a $C_{2-20}$ alkenyl group, c) a $C_{2-20}$ alkynyl group, d) a $C_{1-20}$ alkoxy group, e) a $C_{1-20}$ alkylthio group, f) a —C(O)—$C_{1-20}$ alkyl group, g) a —C(O)—$C_{2-20}$ alkenyl group h) a —C(O)O—$C_{2-20}$ alkynyl group i) a —C(O)O—$C_{1-20}$ alkyl group, j) a —C(O)O—$C_{2-20}$ alkenyl group, k) a —Y—$C_{3-10}$ cycloalkyl group, l) a —Y—$C_{6-14}$ aryl group, m) a —Y-3-12 membered cycloheteroalkyl group, or n) a —Y-5-14 membered heteroaryl group, wherein each of the $C_{1-20}$ alkyl group, the $C_{2-20}$ alkenyl group, the $C_{2-20}$ alkynyl group, the $C_{3-10}$ cycloalkyl group, the $C_{6-14}$ aryl group, the 3-12 membered cycloheteroalkyl group, and the 5-14 membered heteroaryl group is optionally substituted with 1-4 $R^1$ groups,
$R^1$ is independently selected from a —S(O)$_m$—$C_{1-20}$ alkyl, b) —S(O)$_m$—O$C_{1-20}$ alkyl, c) —S(O)$_m$—O$C_{6-14}$ aryl, d) —C(O)—O$C_{1-20}$ alkyl, e) —C(O)—O$C_{6-14}$ aryl, f) a $C_{1-20}$ alkyl group, g) a $C_{2-20}$ alkenyl group, h) a $C_{2-20}$ alkynyl group, i) a $C_{1-20}$ alkoxy group, j) a $C_{3-10}$ cycloalkyl group, k) a $C_{6-14}$ aryl group, l) a 3-12 membered cycloheteroalkyl group, or m) a 5-14 membered heteroaryl group,
Y is independently selected from a divalent $C_{1-6}$ alkyl group, O, S, C(O), C(O)O, or a covalent bond; and
V is S or Se,
W is CH or N, and
X is selected from Cl, Br and I.

In a preferred embodiment, R is independently selected from a) a $C_{1-20}$ alkyl group, d) a $C_{1-20}$ alkoxy group, and f) a —Y—$C_{6-14}$ aryl group, as defined above. More preferred, R is selected from a) a $C_{1-20}$ alkyl group and d) a $C_{1-20}$ alkoxy group, as defined above. In particular, R is a $C_{1-20}$ alkyl group. R is particularly preferred a linear or branched $C_6$-$C_{20}$ alkyl, e.g. n-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, n-nonadecyl, n-isosyl, 1-methylpentyl, 1-methylhexyl, 2-methylpentyl, 2-ethylhexyl, and 2,7-dimethyloctyl.

The reactive zinc is a highly reactive zerovalent zinc metal species which is composed of formerly zerovalent zinc metal particles in a finely divided powdered form, and can be prepared as described in WO 93/15086. The reactive zinc is in general prepared from the reduction of a zinc(II) salt, the counter ion of which can be any of a variety of anions that does not contain an acidic proton, for example a sulphate, nitrate, nitrite, acetate, cyanide, or halide. The reducing agent is an alkali metal or an alkali metal complex, preferably a complex of an alkali metal and naphthalene, especially a complex of lithium and naphthalene. For example, the reactive zinc species can be prepared by reduction of $ZnCl_2$ or $Zn(CN)_2$ in the presence of an alkali metal, such as lithium, and an effective catalytic amount of an electron transfer compound, such as naphthalene in THF or glyme (1,2-dimethoxyethane).

The reaction of the 3-substituted 2,5-dihalothiophene with reactive zinc is generally conducted under exclusion of water and oxygen. Typically, the reaction is carried out in the same medium used to produce the highly reactive zinc species. Preferably, the reaction is carried out in an ether, polyether or hydrocarbon solvent, most preferably the reaction is carried out in THF.

A slight molar excess of the reactive zinc is used. Preferably, at least 1,2 equivalent of reactive zinc is used per equivalent of 3-substituted 2,5-dihalothiophene or 2,5-dihaloselenophene. The reactive zinc reacts with the 3-substituted 2,5-dihalothiophene regioselectively, wherein the regioselectivity is in general at least 80%. For example, reactive zinc reacts with 3-hexyl-2,5-dibromothiophene to give an regioisomer mixture of 2-bromo-5-bromozinc-3-hexylthiophene (IIa) and 5-bromo-2-bromozinc-3-hexylthiophene (IIb) in a ratio of about 9:1 at room temperature.

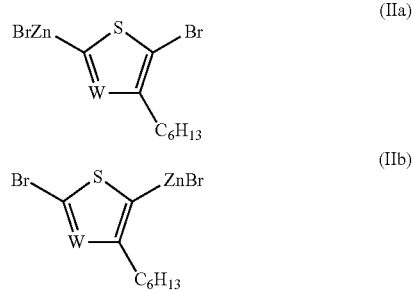

Alternatively, the 3-substituted 2,5-dihalothiophene can be reacted with an organomagnesium halide. The organomagnesium halide may be any Grignard reagent R—MgX, wherein X is Cl, Br or I, but is typically Cl or Br, and R is typically any alkyl, vinyl or phenyl group, for example $CH_2$—CH=$CH_2$, —$C_3H_7$, —$C_6H_{13}$, —$C_{12}H_{29}$, isopropyl and tert-butyl groups. Preferably, the 3-substituted 2,5-dihalothiophene or 2,5-dihaloselenophene is dissolved in an organic solvent, and the organomagnesium halide is added to the solution under an inert gas atmosphere, preferably at a temperature of from 0° C. to 25° C. Alternatively, the organomagnesium halide is dissolved in an organic solvent and the educt added to the solution. The educt to be added to the solution can itself also be dissolved in the solvent, and the two solution then be combined. The organomagnesium halide is preferably added in a ratio of from 0.9 to 1.05 equivalents, most preferably from 0.95 to 0.98 equivalents with respect to the educt. Preferred solvents are selected from linear or cyclic organic ethers and include diethylether, THF, 2-methyltetrahydrofuran, tetrahydropyran and dioxan. The reaction is generally carried out in the absence of oxygen and water. The educt and the organomagnesium halide react into a Grignard intermediate product, which is usually a mixture of regioisomers of formula IIIa and IIIb:

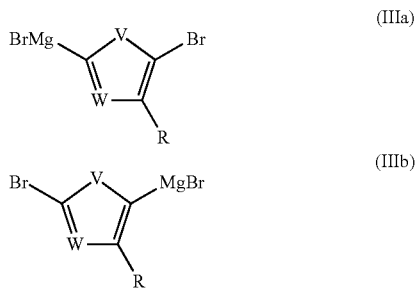

The organomagnesium intermediate, or the mixture of intermediate of formula IIIa and IIIb, can be also generated by using pure magnesium instead of an organomagnesium halide, as described in WO 2005/014691.

In step b), the organozinc or organomagnesium intermediate is brought into contact with a Ni(0), Ni(II), Pd(0) or Pd(II) catalyst to initiate the polymerization reaction. Suitable Ni(0) or Ni(II) catalysts are for example Ni(dppp)Cl$_2$ (wherein dppp=1,3-bis(diphenylphosphino)propane), Ni(dppe)Cl$_2$ (wherein dppe=1,2-bis(diphenylphosphino)ethane), tetrakis (triphenylphosphin)nickel(0), Ni(acac)Cl$_2$ (wherein acac=acetylacetonate), bis(triphenylphosphin)dicarbonylnickel(0), bis(1,5-cyclooctadien)nickel(0) and tetrakis (triphenylphosphin)nickel(0). The catalyst may be added in an amount of generally from 0.1-1 mol % with respect to the organozinc or organomagnesium intermediate. The Ni(II) catalyst is generally employed as a slurry in a solvent, typically in a hydrocarbon, ether or cyclic ether solvent, such as THF. According to the present invention, the solution containing the organozinc or organomagnesium intermediate from step a) is cooled to a temperature in the range of from −40 to 5° C. or below, and the solution containing the catalyst, for example a Ni(II) catalyst, is added in a manner that the temperature of the mixture does not exceed the starting temperature $T_1$. Usually, the mixing step b) is carried out fast, e.g. by adding the catalyst containing solution in one portion or within a short time of e.g. from 1 to 120 seconds.

In step c) the organozinc or organomagnesium intermediate is polymerized in the presence of the catalyst to give a regioregular head-to-tail poly(3-substituted thiophene), poly (3-substituted selenophene), poly(3-substituted thiazole) or poly(3-substituted selenazole). The polymerization reaction is carried out at increasing temperature rising from lower temperature $T_1$ ranging from −40 to 5° C. to a higher temperature $T_2$ ranging from −20 to 40° C. during a time period $t_1$, wherein $T_2-T_1$ is at least 10° C. the average rate of increase $(T_2-T_1)/t_1$ ranges from 0.05° C./min to 1° C./min. The starting temperature $T_1$ may depend on the reactivity of the catalyst used. In one preferred embodiment, $T_1$ ranges form 0 to 5° C. and $T_2$ ranges from 10 to 40° C., and $(T_2-T_1)/t_1$ ranges from 0.1° C./min to 1° C./min. Hence $t_1$ ranges from 10 min to 400 min. In general, $t_1$ is from 15 to 240 min, preferably from 15 to 120 min and more preferably from 20 to 90 min. Generally, the temperature is being increased constantly over $t_1$ in case that the temperature is increased discontinuously, it is preferred that the actual rate of increase does not exceed 10° C./min at any time within the time period $t_1$. The actual rate of increase can follow a linear or an exponential function or any other function, however, the average rate of increase is within the limits as defined above.

Generally, the polymerization reaction is continued after $T_2$ is reached during a further time period $t_2$ at $T_2$. In general, $t_2$ ranges from 0 to 600 min. Typically, $t_2$ ranges from 30 to 240 min.

By carrying out the polymerization reaction at increasing temperature according to the invention, a higher regioregularity is achieved. The regioregularity determined by $^1$H-NMR is in general ≥97%, preferably ≥98%, and in particular ≥99%. By contrast, if the reaction is carried out at a temperature $T_2$ from the beginning of the polymerization, a lower regioregularity of <97% is obtained.

The product can be purified by Soxhlet extraction using hexane and acetone as extractant. The product can be further purified by precipitation.

The polymers may be end-capped by several groups as known from the prior art. Preferred end groups are H, substituted or unsubstituted phenyl or substituted or unsubstituted thiophene, without restriction thereto.

The copolymers produced according to the present invention can be used to produce optical, electronic and semiconductor materials, especially as charge transport materials in field-effect transistors (FETs), for example as components of integrated circuits (ICs), RFID tags, backplane pixel drives. In particular, they can be used in organic photovoltaic devices. Alternatively, they can be used in organic light-emitting diodes (OLEDs) in electroluminescent displays or as backlighting, for example liquid-crystal displays (LCDs), in photovoltaic applications or for sensors, for electrophotographic recording and other semiconductor applications.

A further aspect of the invention relates to both the oxidised and reduced form of the polymers according to this invention. Either loss or gain of electrons results in formation of a highly delocalised ionic form, which is of high conductivity. This can occur on exposure to common dopants. Suitable dopants and methods of doping are known to those skilled in the art, e.g., from EP 0 528 662, U.S. Pat. No. 5,198,153 or WO 96/21659.

The conducting form of the polymers of the present invention can be used as an organic "metal" in applications, for example, but not limited to, charge injection layers and ITO planarising layers in organic light emitting diode applications, films for flat panel displays and touch screens, antistatic films, printed conductive substrates, patterns or tracts in electronic applications such as printed circuit boards and condensers.

Since the polymers produced according to the present invention are soluble in organic solvent or water, they can be applied to the substrates from solution. Layers can therefore be applied with inexpensive processes, for example with coating methods such as spin-coating or printing technologies such as gravure printing.

Suitable solvents or solvent mixtures comprise, for example, ether, aromatics and especially chlorinated solvents.

FETs and other components comprising semiconductor materials, for example diodes, can be used advantageously in ID tags or security labels in order to indicate authenticity and to prevent forgeries of valuable items such as banknotes, credit cards, identity documents such as ID cards or driving licenses or other documents with pecuniary advantage such as rubber stamps, postage stamps or tickets, etc.

Alternatively, the polymers produced according to the present invention can be used in organic light-emitting diodes (OLEDs), for example in displays or as backlighting for liquid-crystal displays (LCDs). Typically, OLEDs have a multilayer structure. A light-emitting layer is generally embedded between one or more electron- and/or hole-transporting layers. When an electrical voltage is applied, the electrons or holes can migrate in the direction of the emitting layer, where their recombination to the excitation and subsequent luminescence of the luminophoric compounds in the emitting layer. The polymers, materials and layers may, according to their electrical and optical properties, find use in one or more of the transport layers and/or emitting layers. When the compounds, materials or layers are electroluminescent or have electroluminescent groups or compounds, they are particularly suitable for the emitting layer.

Like the processing of suitable polymers for use in OLEDs, the selection is common knowledge and is described, for example, in Synthetic Materials, 111-112 (2000), 31-34 or J. Appl. Phys., 88 (2000) 7124-7128.

EXAMPLES

All quantitative data (percentages, ppm, etc.) are based on the weight, based on the total weight of the mixture, unless stated otherwise.

Example 1

Preparation of the Organozinc Compound

A 5 l flask with a magnetic stirrer is inertized by repeated evacuation and introduction of argon gas, and filled with a suspension of active zinc (Rieke Metals Inc., 100 g/l, 226 g of zinc) with the aid of a plastic cannula. The internal temperature is brought to approx. −10° C. by cooling, before 958.0 g of 2,5-dibromo-3-hexylthiophene (2.873 mol) are cautiously added dropwise with stirring at such a rate that the internal temperature does not exceed 0° C. The reaction mixture is brought slowly to room temperature and stirred for a further 10 h. After the stirrer has been switched off, the unconsumed zinc settles out. The supernatant solution is cautiously drawn off with a steel cannula and diluted to a concentration of 0.5 M with anhydrous THF. The conversion and composition of the product mixture are determined by gas chromatography. The conversion is >99%, an isomer mixture of 2-bromo-3-hexyl-5-thienylzinc bromide and 5-bromo-3-hexyl-2-thienylzinc bromide in a molar ratio of 9:1 being formed.

Examples 2a-2g

Polymerization to poly(3-hexylthiophene)

140 g of solution from Example 1 (70 mmol of isomer mixture) are introduced into an inertized flask under a nitrogen atmosphere and brought to the start temperature (see table). 131.2 mg of [1,2-bis(diphenylphosphino)ethane]dichloronickel(II) (0.249 mmol), suspended in 15 g of THF, are added rapidly to this solution. The temperature of the reaction mixture is then increased at a defined rate of rise over a defined period (see Table 1). The reaction conversion is monitored by sampling and GC analysis. The reaction is finally stopped by adding 5 ml of concentrated hydrochloric acid and the polymer is immediately precipitated in 1.5 l of methanol. The polymer is filtered off as a solid, washed and dried.

Determination of the Molecular Weight

Poly(3-hexylthiophene) is dissolved in chloroform (approx. 0.05% by weight) and analyzed with a standard GPC apparatus with THF as the eluent (injection: waters 717 autosampler; volume 100 μl; flow rate: 1 ml/min; pump: waters model 515, double piston pump; detection: WATERS Lambda-Max 481 UV detector @ 450 nm, WATERS 410 differential refractometer, measurement temperature 35° C., column set: PL-gel columns from Polymer Laboratories, 4 columns each of length 30 cm and diameter 0.77, crosslinked polystyrene-divinylbenzene matrix, particle size 5 μm, pore sizes: 2×500 Å, 1×1000 Å, 1×10 000 Å, calibration: PS standards from PL in the range of 312-450 000 g/mol, evaluation: PSSWinGPC Unity)

Determination of the Regioregularity

A small amount of the crude polymer (approx. 5 mg) is dissolved in 1 ml of deuterated chloroform and filled into an NMR tube. $^1$H NMR spectra of the samples are recorded and evaluated with the software Mestre-C Version 2.3. The ratio of the head-tail and head-head linkages is employed in order to determine the regioregularity of the polymer back wheel. For this purpose, the signals of the α-methylene protons are suitable, which occur at 2.80 ppm in the case of a head-tail linkage and at 2.59 ppm in the case of a head-head linkage. The areas under the corresponding signals A are integrated with the aid of the analysis software. The regioregularity is calculated by the following formula:

$$RR = 100\% - \frac{A(\text{head} - \text{head})}{[A(\text{head} - \text{tail}) + A(\text{head} - \text{head})]}$$

The results are summarized in the table below.

TABLE 1

| Batch | Temperature profile | Mw/Mn = PDI | Conversion | Regioregularity |
|---|---|---|---|---|
| a | linear 0-20° C. in 60 min; 20° C. for a further 1.5 hours | 23k/12k = 1.9 | 85% | >98% |
| b (Comp.) | constant 20° C. | 24k/11k = 2.1 | 88% | 96% |
| c (Comp.) | constant 30° C. | 25k/10k = 2.5 | 93% | 94% |
| d | linear 0-40° C. in 60 min | 27k/13k = 2.1 | 94% | 98% |
| e | linear 0-10° C. in 60 min; 10° C. for a further 1.5 hours | 23k/11k = 2.1 | 74% | >98% |
| f | linear 0-20° C. in 30 min; 20° C. for a further 2 hours | 24k/12k = 2.0 | 80% | 97% |
| g (0.625 mol % of cat) | linear 0-20° C. in 60 min; 20° C. for a further 1.5 hours | 15k/21k = 1.4 | 84% | >98% |

Example 3

Synthesis on the Pilot Plant Scale

A 60 l steel tank is cleaned by boiling with solvents, then dried at 80° C. under reduced pressure (10 mbar) and repeatedly purged with nitrogen. 24 kg of an isomer mixture of 2-bromo-3-hexyl-5-thienylzinc bromide and 5-bromo-3-hexyl-2-thienylzinc bromide in THF (0.5 M, isomer ratio approx. 9:1) are initially charged and cooled to 4° C. with stirring. After cooling, 23.68 g of [1,2-bis(diphenylphosphino)ethane]dichloronickel(II) (44.84 mmol), suspended in 400 g of THF, are injected rapidly through an inertized bomb tube. The reaction mixture is then heated to 30° C. within 90 min. The tank contents are pumped undiluted onto 250 kg of methanol and the tank is washed with a little (approx. 5 kg) of THF. The solid is filtered off with the aid of a Seitz filter (diameter 30 cm, 40 μm metal mesh filter) and washed with a further 250 kg of methanol. This affords 1.6 kg of the polymer with a weight-average molecular weight of 30 kg mol$^{-1}$ (polydispersity approx. 1.9).

Example 4

Purification of the poly(3-hexylthiophene) on the Laboratory Scale for Use in Electronic Components 10 g of the crude polymer are extracted in a Soxhlet extractor first with hexane and then with acetone. The solid residue is then dissolved in chloroform and precipitated in methanol, washed with methanol, filtered off and dried at 40° C. under reduced pressure. This procedure is repeated a second time. This affords pure poly(3-hexylthiophene) which has no monomer residues and whose residual metal content is less than 10 ppm.

Example 5

Characterization of the poly(3-hexylthiophene) in FETs

To produce field-effect transistors (FETs), doped silicon wafers with 200 nm-thick, thermally grown silicon dioxide are used as the substrate. Source/drain electrodes of gold (thickness approx. 40 mm) are structured lithographically. The dielectric boundary layer is modified with hexamethyldisilazane by gas phase deposition. The poly(3-hexylthiophene) layers were applied by spin-coating (5000 rpm, 30 s) to a solution composed of 40 mg/ml in chlorobenzene. Before the characterization, the film was dried briefly at 90° C.

All steps were performed without protective gas atmosphere. The FET characteristics are recorded under yellow light with a Keithley 4200 semiconductor parameter analyzer, and averaged. The results are reproduced in Table 2 below.

TABLE 2

| Example 2 | $\mu_{sat}$/cm2V$^{-1}$s$^{-1}$ | On/off (0--−60 V) | Vonset |
|---|---|---|---|
| a | 0.15 (holes) | 10$^3$ | +20 V |
| c (comp.) | 0.01 (holes) | 10$^3$ | +15 V |

It is found that the material with the higher regioregularity produced in accordance with the invention has a significantly higher charge mobility in the FET than the comparative material.

The invention claimed is:

1. A process for preparing a regioregular homopolymer or copolymer of a 3-substituted thiophene, a 3-substituted selenophene, a 3-substituted thiazol, or a 3-substituted selenazol, the process comprising:
    a) reacting a 3-substituted 2,5-dihalothiophene, a 3-substituted 2,5-dihaloselenophene, a 3-substituted 2,5-dihalothiazol, or a 3-substituted 2,5-dihaloselenazol with at least one selected from the group consisting of reactive zinc metal, magnesium metal, and an organomagnesium halide, to obtain an organozinc or organomagnesium intermediate comprising a halozinc or a halomagnesium group;
    b) contacting the organozinc or the organomagnesium intermediate with a Ni(II), a Ni(0), a Pd(II), or a Pd(0) catalyst; and
    c) polymerizing the organozinc or the organomagnesium intermediate, to obtain a regioregular head-to-tail homopolymer or copolymer of a 3-substituted thiophene, a 3-substituted selenophene, a 3-substituted thiazol, or a 3-substituted selenazol, wherein:
    the polymerizing occurs at a temperature rising from a lower temperature T$_1$ to a higher temperature T$_2$ during a time t$_1$;
    T$_1$ is in a range of from −40 to 5° C.;
    T$_2$ is in a range of from −20 to 40° C.;
    T$_2$−T$_1$ is at least 10° C.; and
    an average rate of increase (T$_2$−T$_1$)/t$_1$ is in a range of from 0.05° C./min to 1° C./min.

2. The process of claim 1, wherein T$_1$ is in a range of from 0 to 5° C. and T$_2$ is in a range of from 10 to 40° C.

3. The process of claim 1, wherein t$_1$ is from 15 to 120 min.

4. The process of claim 1, wherein the polymerizing is continued at T$_2$ during a time period t$_2$.

5. The process of claim 4, wherein t$_2$ is from 30 to 240 min.

6. The process of claim 1, wherein the 3-substituted 2,5-dihalothiophene, 3-substituted 2,5-dihaloselenophene, 3-substituted 2,5-dihalothiazol or 3-substituted 2,5-dihaloselenazol is a compound of formula (I):

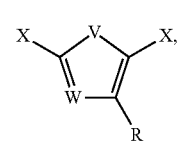

wherein:
    R is selected from the group consisting of a) a C$_{1-20}$ alkyl group, b) a C$_{2-20}$ alkenyl group, c) a C$_{2-20}$ alkynyl group, d) a C$_{1-20}$ alkoxy group, e) a C$_{1-20}$ alkylthio group, f) a —C(O)—C$_{1-20}$ alkyl group, g) a —C(O)—C$_{2-20}$ alkenyl group, h) a —C(O)O—C$_{2-20}$ alkynyl group, i) a —C(O)O—C$_{1-20}$ alkyl group, j) a —C(O)O—C$_{2-20}$ alkenyl group, k) a —Y—C$_{3-10}$ cycloalkyl group, l) a —Y—C$_{6-14}$ aryl group, m) a —Y-3-12 membered cycloheteroalkyl group, and n) a —Y-5-14 membered heteroaryl group,
    wherein each of the C$_{1-20}$ alkyl group, the C$_{2-20}$ alkenyl group, the C$_{2-20}$ alkynyl group, the C$_{3-10}$ cycloalkyl group, the C$_{6-14}$ aryl group, the 3-12 membered cycloheteroalkyl group, and the 5-14 membered heteroaryl group is optionally substituted with 1-4 R$^1$ groups;
    each R$^1$ is independently selected from the group consisting of a) —S(O)$_m$—C$_{1-20}$ alkyl, b) —S(O)$_m$—OC$_{1-20}$ alkyl, c) —S(O)$_m$—OC$_{6-14}$ aryl, d) —C(O)—OC$_{1-20}$ alkyl, e) —C(O)—OC$_{6-14}$ aryl, f) a C$_{1-20}$ alkyl group, g) a C$_{2-20}$ alkenyl group, h) a C$_{2-20}$ alkynyl group, i) a C$_{1-20}$ alkoxy group, j) a C$_{3-10}$ cycloalkyl group, k) a C$_{6-14}$ aryl group, l) a 3-12 membered cycloheteroalkyl group, and m) a 5-14 membered heteroaryl group;
    each Y is independently a divalent C$_{1-6}$ alkyl group, O, S, C(O), C(O)O, or a covalent bond;
    V is S or Se;
    W is CH or N; and
    X is selected from the group consisting of Cl, Br, and I.

7. The process of claim 6, wherein V is S.

8. The process of claim 7, wherein W is CH.

9. The process of claim 7, wherein R is a C$_{1-20}$ alkyl group or a C$_{1-20}$ alkoxy group.

10. The process of claim 2, wherein t$_1$ is from 15 to 120 min.

11. The process of claim 2, wherein the polymerizing is continued at $T_2$ during a time period $t_2$.

12. The process of claim 3, wherein the polymerizing is continued at $T_2$ during a time period $t_2$.

13. The process of claim 11, wherein $t_2$ is from 30 to 240 min.

14. The process of claim 12, wherein $t_2$ is from 30 to 240 min.

15. The process of claim 8, wherein R is a $C_{1-20}$ alkyl group or a $C_{1-20}$ alkoxy group.

16. The process of claim 1, wherein $t_1$ is from 20 to 90 min.

17. The process of claim 6, wherein R is selected from the group consisting of a $C_{1-20}$ alkyl group, a $C_{1-20}$ alkoxy group, and a —Y—$C_{6-14}$ aryl group.

18. The process of claim 6, wherein R is a $C_{1-20}$ alkyl group or a $C_{1-20}$ alkoxy group.

19. The process of claim 6, wherein R is a $C_{1-20}$ alkyl group.

20. The process of claim 19, wherein R is a linear or branched $C_{6-20}$ alkyl group.

\* \* \* \* \*